Aug. 14, 1973 E. KOOI ET AL 3,752,711

METHOD OF MANUFACTURING AN IGFET AND THE PRODUCT THEREOF

Filed June 1, 1971

INVENTOR.
ELSE KOOI

BY

AGENT

United States Patent Office 3,752,711
Patented Aug. 14, 1973

3,752,711
METHOD OF MANUFACTURING AN IGFET AND THE PRODUCT THEREOF

Else Kooi, Emmasingel, Eindhoven, Netherlands, assignor to U.S. Philips Corporation, New York, N.Y.

Filed June 1, 1971, Ser. No. 148,416
Claims priority, application Netherlands, June 4, 1970, 7008101
Int. Cl. H01l 7/40, 11/00
U.S. Cl. 148—33.3 7 Claims

ABSTRACT OF THE DISCLOSURE

The invention relates to a method of manufacturing an insulated gate field effect transistor in which an inset silicon oxide layer is provided on the surface of a silicon body by means of a masking layer which masks against oxidation.

Figures 1, 2, 3:
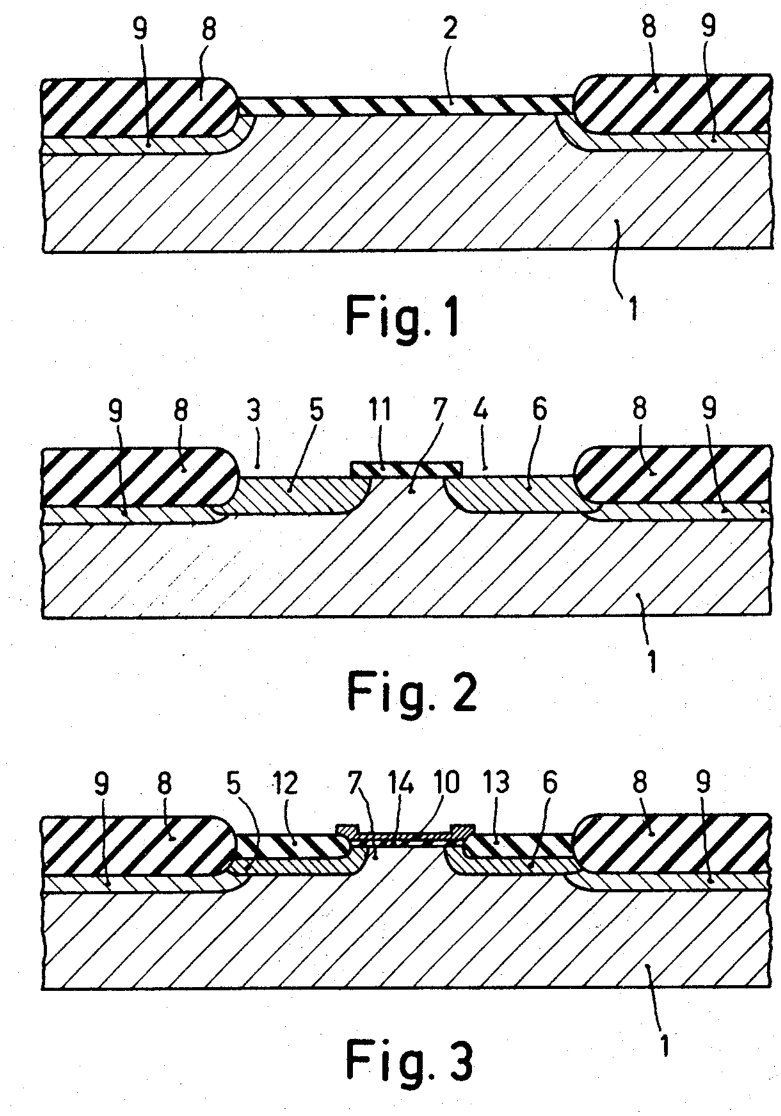

This masking layer may also be used for masking during the diffusion of an impurity to obtain a channel stopper in the field effect transistor below the inset oxide layer. Gallium or aluminium as an impurity may be diffused, for example, via the inset oxide layer.

The invention relates to a method of manufacturing a semiconductor device comprising a semiconductor body of silicon of one conductivity type in which two surface zones of the opposite conductivity type are present which constitute the source and drain zones of an insulated gate field effect transistor, and in which the channel region of the field effect transistor adjoining the silicon surface extends between the source and drain zones, a masking layer which, at least over a part of its thickness, consists of a material masking against oxidation and differing from silicon oxide being provided on a part of the silicon body and at least on the channel region, the part of the surface of the silicon body not masked against oxidation being subjected to an oxidation treatment to obtain a silicon oxide layer which is inset in the silicon body over at least part of its thickness, and to a semiconductor device manufactured by means of the method.

Such a method is described in Dutch patent application No. 6707956. This method enables, inter alia, conductors and connection wires to be provided on thick oxide layers, said conductors and wires having a small capacity relative to parts situated below the oxide layers. Moreover, as a result of the oxide layers which are at least partly inset, a surface is obtained which is smoother than that of semiconductor devices having non-inset oxide layers of the same thickness.

The insert oxide layer extends at least over a part of the surface of the silicon body present around the source and drain zones and the channel region. It has now been found that, even below comparatively thick inset silicon oxide layers (for example, having a thickness of approximately 1 $\mu$m.), stray channels can be formed, for example, under the influence of current conductors present on the oxide layer, which channels adversely influence the operation of the field effect transistor. This phenomenon occurs in particular in field effect transistors, in which an n-type channel is formed in the channel region, but may also occur in the case in which a p-type channel is formed in the channel region during use.

One of the objects of the invention is to provide a simple solution by which stray channel formation is prevented.

Therefore, the method described in the preamble is characterized according to the invention in that, while using the layer masking against oxidation as a diffusion mask, an impurity is diffused in the silicon body to obtain a channel stopper of one conductivity type which is present below the inset silicon oxide layer, adjoins the source and drain zones and has a higher doping concentration than the adjoining part of the silicon body. As a result of the shape of the channel stopper and the instant at which it is provided, the invention enables the channel stopper to be provided without the use of a special mask.

At least the part of the masking layer present on the channel region is preferably used as a part of a diffusion mask during the diffusion of another impurity in the silicon body to obtain the source and drain zones. As a result of this a readily defined channel region can also be obtained by means of the masking layer for which no precision alignment step is necessary since the main thing is the correct width of the channel region.

The channel stopper is preferably provided with a lower concentration of the impurity than the surface concentration of the other impurity in the source and drain zones. This is particularly important in the case in which the impurity to obtain the channel stopper is also diffused at the region of the source and drain zones.

The method according to the invention is of particular importance for the manufacture of field effect transistors in which an n-type channel is formed in the channel region, an acceptor impurity, for example boron, being diffused in the silicon body to obtain a channel stopper of the p-conductivity type.

After performing the oxidation treatment, gallium or aluminum is preferably diffused as an impurity to obtain the channel stopper. Of course, the material masking against oxidation should also mask against diffusion of gallium or aluminum. Gallium and aluminum will diffuse through a silicon oxide layer. The use of gallium or aluminum consequently increases the number of possibilities to form the channel stopper in the silicon body.

For example, gallium or aluminum can also be diffused after the formation of the source and drain zones, if desirable also after said zones have been provided with an inset oxide layer. A condition in all these cases is that the masking layer which consists at least over part of its thickness of a material masking against oxidation and differing from silicon oxide, is present at least on the channel region. In many cases, the channel stopper together with the source and drain zones will bound the channel region so that stray channel formation in complicated MOS structures is avoided.

In an important embodiment of the method according to the invention the masking layer is provided on the surface of that part of the silicon body which is destined for the channel region and on the surface of the source and drain zones to be diffused, after which the inset oxide layer is formed and apertures are made in the masking layer to diffuse the other impurity in the silicon body to obtain the source and drain zones, the impurity to obtain the channel stopper being diffused in a stage after the provision of the masking layer.

The method according to the invention avoids the steps of providing a separate diffusion masking layer and precision photoetching of said layer which steps are conventional for diffusion processes.

The invention furthermore relates to a semiconductor device obtained by the method according to the invention.

In order that the invention may be readily carried into effect, a few examples thereof will now be described in greater detail with reference to the accompanying drawings, in which:

FIGS. 1, 2 and 3 are diagrammatic cross-sectional views of a part of a field effect transistor in successive stages of manufacture by means of the method according to the invention.

In this method a semiconductor device (see FIG. 3) is manufactured comprising a semiconductor body 1 of silicon of one conductivity type in which two surface zones 5 and 6 of the opposite conductivity type are present which constitute the source and drain zones of a field effect transistor having an insulated gate electrode 10. The channel region 7 of the field effect transistor adjoining the silicon surface extends between the source and drain zones 5 and 6. In the method according to the invention a masking layer 2, which at least over part of its thickness consists of a material masking against oxidation and differing from silicon oxide, for example, silicon nitride, is provided on a part of the silicon body 1 and at least on the channel region 7 (see FIG. 1).

The part of the surface of the silicon body 1 not masked against oxidation is subjected to an oxidation treatment to obtain a silicon oxide layer 8 which is inset in the silicon body 1 at least over part of its thickness.

According to the invention, an impurity is diffused in the silicon body 1, while using the layer 2 masking against oxidation as a diffusion mask, to obtain a channel stopper 9 situated below the inset silicon oxide layer 8 and adjoining the source and drain zones 5 and 6. The channel stopper 9 is of one conductivity type and has a higher doping concentration than the adjoining part of the silicon body 1.

The same masking layer which is used as an oxidation mask is hence also used as a diffusion mask so that the provision and the photoetching of a separate diffusing masking layer is avoided.

At least the part 11 of the masking layer 2 present on the channel region (see FIG. 2) is used as a part of a diffusion mask 8, 11 during the diffusion of another impurity in the silicon body to obtain the source and drain zones 5 and 6. As a result of this a readily defined channel region 7 is obtained in a simple manner.

The part 11 of the masking layer present on the channel region 7 may be replaced, for diffusing the source and drain zones, by another masking layer which is composed, for example, of layers of silicon oxide and of polycrystalline silicon or molybdenum.

The channel stopper is preferably provided with a lower concentration of the impurity than the surface concentration of the other impurity in the source and drain zones.

After the oxidation treatment, gallium or aluminum is preferably diffused as an impurity to obtain the channel stopper 9. The use of these elements increases the number of possibilities to form the channel stopper in the silicon body, as will be described hereinafter.

In a preferred embodiment of the method according to the invention, the masking layer 2 is provided on the surface of that part of the silicon body 1 which is destined for the channel region 7 and on the surface of the source and drain zones 5 and 6 to be diffused (see FIG. 1). The inset oxide layer 8 is then formed and apertures 3 and 4 (see FIG. 2) are made in the masking layer to diffuse the other impurity in the silicon body to obtain the source and drain zones 5 and 6. In a stage after the provision of the masking layer the impurity is diffused to obtain the channel stopper.

Starting material is, for example, a p-type silicon body 1 (see FIG. 1) having a resistivity of, for example, 10 ohm/cm. and a thickness of approximately 200 $\mu$m. The further dimensions of the silicon body are of no significance and should only be sufficiently large to be able to provide the field effect transistor. A number of field effect transistors will usually be provided simultaneously in a silicon body and the silicon body will then be severed, for example, after a number of field effect transistors have been connected together in integrated circuits.

A layer of silicon nitride, thickness approximately 0.2$\mu$, is provided on the silicon body. This layer may be provided in a usual manner by leading over a mixture of gas of silane and ammonia at 1000° C. Silicon nitride masks against oxidation.

By means of a usual photomasking method, the silicon nitride layer is removed with the exception of the part 2 which has a width of approximately 65 $\mu$m. The inset silicon oxide layer 8, thickness approximately 0.8 $\mu$m. is then provided by oxidation. For that purpose, for example, steam is led over the silicon body which is maintained at a temperature of approximately 1000° C. until the desirable thickness has been obtained. The silicon oxide layer 8 is inset in the silicon body 1 over a thickness of approximately 0.35 $\mu$m.

While using the silicon nitride layer 2 as a diffusion mask, gallium or aluminum is then diffused in the silicon body via the silicon oxide layer 8 to obtain the channel stopper 9 present below the silicon oxide layer 8.

For that purpose, in the case of diffusion of aluminum, the silicon body is arranged in a tray of aluminum oxide which is closed with an aluminum oxide cover. The tray also contains an alloy of 10% by weight of aluminum with 90% by weight of silicon. Upon heating for 60 minutes at 1000° C. in a flow of hydrogen, aluminum is diffused in the silicon body to a depth of approximately 1 $\mu$m. The surface concentration is $5\times10^{17}$ at cc.

In the case in which gallium is is diffused, silicon powder is used which comprises $10^{18}$ atoms per cc. of gallium and heating is carried out at 1100° C. in a vacuum for 20 minutes. The diffusion depth and the surface concentration of the gallium are substantially equal to the above-mentioned values of aluminum. The said surface concentrations become slightly lower in the subsequent oxidation treatment.

By means of warm phosphoric acid, the apertures, 3 and 4 having a width of approximately 25 $\mu$m. are then etched in the silicon nitride layer 2 in a usual manner (see FIG. 2). The thickness of the oxide layer 8 is substantially not reduced.

Phosphorus is diffused in the silicon body 1 via the apertures 3 and 4. For this purpose, the silicon body, together with a quantity of phosphorus-doped silicon powder, is heated at a temperature of approximately 1000° C. for approximately 10 minutes in an evacuated quartz tube, after which the silicon body is removed from the quartz tube.

The silicon body is then heated at a temperature of approximately 1000° C., steam being led over the body 1 until silicon oxide layers 12 and 13 (see FIG. 3) of approximately 0.4 $\mu$m. have been obtained in the apertures 3 and 4. This thickness of the silicon oxide layer 8 increases and reaches a value of approximately 0.9 $\mu$m. The surface concentration of the phosphorus in the silicon body is approximately $5\times10^{19}$ at./ccm.

During the oxidation process the phosphorus diffuses further. The n-type source and drain zones 5 and 6 obtain a thickness of well over 1 $\mu$m.

The silicon nitride layer 11 present on the channel region 7 may be replaced by a silicon oxide layer 14 which is thinner than the inset oxide layer, after which the gate electrode 10 is provided on the said thin layer.

The source and drain zones and the gate electrode are provided with current conductors in a usual manner.

The invention is not restricted to the diffusion of gallium or aluminum. For example, prior to the provision of the layer 8, the channel stopper 9 can be obtained by diffusion of, for example, boron.

Gallium or aluminum may also be diffused after the diffusion of phosphorus or after the silicon oxide layers 12 and 13 have been obtained in the apertures 3 and 4, it being ensured that the source and drain zones do not become excessively doped.

The diffusion of the impurity to obtain the channel stopper may also be combined with methods in which the silicon nitride layer 2 does initially not extend over the region shown in FIG. 1, but only over the region shown in FIG. 2. The inset oxide layer may then be provided and the source and drain zones diffused, which steps may be preceded or succeeded by the diffusion of the impurity to obtain the channel stopper.

The silicon nitride layer may also be used as a diffusion mask for the phosphorus diffusion after which the part of the silicon nitride layer not present on the channel region is removed and the silicon surface present outside the channel region is oxidized. The impurity to obtain the channel stopper may be diffused prior to or after the oxidation.

Besides silicon nitride, the masking layer may also consist of another material masking against oxidation, for example, a double layer of aluminum oxide and silicon oxide.

What is claimed is:

1. A method of manufacturing an insulated gate field effect transistor in a semiconductor body, comprising forming in a silicon semiconductor body portion of one type conductivity spaced surface zones of the opposite type conductivity to form source and drain regions separated by a surface channel region, providing on the surface of the semiconductor at least over the part of the surface adjoining the channel region formed or to be formed therein a layer of an oxidation-masking material of other than silicon oxide and capable of preventing oxidation of the underlying silicon surface when the body is subjected to an oxidation treatment, subjecting the body to an oxidation treatment to cause selective oxidation of the silicon surface parts not masked by the oxidation-masking material until a silicon oxide layer is formed which is inset in the silicon over at least part of its thickness, and introducing into the body one-type forming impurities which will be masked by said oxidation-masking layer and which will not be masked by said inset oxide until there is formed in the silicon portions below the inset oxide and adjoining the source and drain zones but not in the channel region a channel-stopper of said one-type conductivity containing a higher concentration of said one-type-forming impurities than that of underlying silicon parts.

2. A method as set forth in claim 1 wherein gallium or aluminum is used as the channel-stopper one-type-forming impurity, and the oxidation-masking layer comprises silicon nitride.

3. A method as set forth in claim 2 wherein the surface concentration of the channel-stopper-forming impurities is lower than that of the opposite-type impurities forming the source and drain zones.

4. An insulated gate field effect transistor made by the method of claim 1.

5. A method of manufacturing an insulated gate field effect transistor in a semiconductor body, comprising providing on the surface of a silicon semiconductor body portion of one type conductivity at least over the part of the surface adjoining source, drain and channel regions to be formed therein a layer of an oxidation-masking material of other than silicon oxide and capable of when the body is subjected to an oxidation treatment and preventing oxidation of the underlying silicon surface also capable of masking against impurities, subjecting the body to an oxidation treatment to cause selective oxidation of the silicon surface parts not masked by the oxidation-masking material until a silicon oxide layer is formed which is inset in the silicon over at least part of its thickness, diffusing into the body one-type forming impurities which will be masked by said oxidation-masking layer and which will not be masked by said inset oxide until there is formed in the silicon portions below the inset oxide and adjoining the source and drain zones to be formed but not in the channel region a channel-stopper of said one-type conductivity containing a higher concentration of said one-type-forming impurities than that of underlying silicon parts, removing part of the oxidation-masking layer over the areas where source and drain regions are to be formed, diffusing impurities of the opposite-type forming kind into the surface, said oxidation-masking layer and said inset oxide masking against said diffused opposite-type impurities whereby there is formed in the body spaced surface zones of the opposite-type conductivity defined by the oxidation-masking layer and the inset oxide and separated by a surface channel region extending underneath the oxidation-masking layer, all bounded by a surrounding channel-stopper.

6. A method as claimed in claim 5 wherein gallium or aluminum is used as the diffused one-type forming impurities, and the oxidation-masking material comprises silicon nitride.

7. A method of manufacturing an insulated gate field effect transistor in a semiconductor body, comprising forming in a silicon semiconductor body portion of one type conductivity spaced surface zones of the opposite type conductivity to form source and drain regions separated by a surface channel region, providing on the surface of the semiconductor at least over the part of the surface adjoining the channel region formed or to be formed therein a layer of an oxidation-masking material of other than silicon oxide and capable of preventing oxidation of the underlying silicon surface when the body is subjected to an oxidation treatment, subjecting the body to an oxidation treatment to cause selective oxidation of the silicon surface parts not masked by the oxidation-masking material until a silicon oxide layer is formed which is inset in the silicon over at least part of its thickness, and introducing into the body one-type forming impurities which will be masked by said oxidation-masking layer until there is formed in the silicon portions adjoining the source and drain zones formed or to be formed but not in the channel region a channel-stopper of said one-type conductivity containing a higher concentration of said one-type-forming impurities than that of underlying silicon parts.

References Cited

UNITED STATES PATENTS

| | | | |
|---|---|---|---|
| 3,544,858 | 12/1970 | Kooi | 317—235 B |
| 3,309,245 | 3/1967 | Haenichen | 148—187 |
| 3,653,978 | 4/1972 | Robinson et al. | 148—1.5 |
| 3,309,246 | 3/1967 | Haenichen | 148—187 |
| 3,417,464 | 12/1968 | Fang et al. | 148—187 X |
| 3,642,545 | 2/1972 | Pammer et al. | 148—187 |

GEORGE T. OZAKI, Piramry Examiner

U.S. Cl. X.R.

148—187, 189; 317—235 R; 29—571, 576

PO-1050
(5/69)

UNITED STATES PATENT OFFICE
CERTIFICATE OF CORRECTION

Patent No. 3,752,711 Dated August 14, 1973

Inventor(s) ELSE KOOI

It is certified that error appears in the above-identified patent and that said Letters Patent are hereby corrected as shown below:

Column 5, delete lines 55 and 56, and insert --preventing oxidation of the underlying silicon surface when the body is subjected to an oxidation treatment and--

Signed and sealed this 22nd day of January 1974.

(SEAL)
Attest:

EDWARD M.FLETCHER,JR.
Attesting Officer

RENE D. TEGTMEYER
Acting Commissioner of Patents